(12) United States Patent
Kishida et al.

(10) Patent No.: US 9,741,588 B2
(45) Date of Patent: Aug. 22, 2017

(54) METHOD OF MANUFACTURING THIN-FILM TRANSISTOR SUBSTRATE

(71) Applicant: JOLED INC., Tokyo (JP)

(72) Inventors: Yuji Kishida, Hyogo (JP); Toshiaki Yoshitani, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/580,896

(22) Filed: Dec. 23, 2014

(65) Prior Publication Data

US 2015/0200113 A1    Jul. 16, 2015

(30) Foreign Application Priority Data

Jan. 10, 2014 (JP) ................................ 2014-003761
Jul. 8, 2014 (JP) ................................ 2014-140843

(51) Int. Cl.
| | | |
|---|---|---|
| H01L 21/477 | (2006.01) | |
| H01L 29/786 | (2006.01) | |
| H01L 29/66 | (2006.01) | |
| H01L 27/12 | (2006.01) | |

(52) U.S. Cl.
CPC ........ *H01L 21/477* (2013.01); *H01L 27/1225* (2013.01); *H01L 27/1248* (2013.01); *H01L 29/66969* (2013.01); *H01L 29/78636* (2013.01); *H01L 29/78693* (2013.01)

(58) Field of Classification Search
CPC ............. H01L 21/477; H01L 29/78693; H01L 29/7869
See application file for complete search history.

(56) References Cited

U.S. PATENT DOCUMENTS

| | | | |
|---|---|---|---|
| 8,143,115 B2 | 3/2012 | Omura et al. | |
| 8,148,721 B2 | 4/2012 | Hayashi et al. | |
| 8,618,536 B2 | 12/2013 | Sugano | |
| 2010/0051936 A1 | 3/2010 | Hayashi et al. | |
| 2010/0065837 A1 | 3/2010 | Omura et al. | |
| 2011/0059575 A1* | 3/2011 | Tsubuku | H01L 29/66969 438/104 |
| 2012/0168750 A1 | 7/2012 | Hayashi et al. | |
| 2013/0126860 A1* | 5/2013 | Fukuda | C08L 79/08 257/43 |
| 2014/0084283 A1* | 3/2014 | Lim | H01L 29/263 257/43 |

FOREIGN PATENT DOCUMENTS

JP    2008-166716    7/2008

\* cited by examiner

*Primary Examiner* — Daniel Whalen
(74) *Attorney, Agent, or Firm* — Greenblum & Bernstein, P.L.C.

(57) ABSTRACT

A method of manufacturing a thin-film transistor substrate which includes a thin-film transistor includes: forming a planarization layer comprising polyimide material above the thin-film transistor; and heating the thin-film transistor at a temperature of 240° C. or lower after the planarization layer is formed.

2 Claims, 12 Drawing Sheets

| Process order | (1) | (2) | (3) | (4) | (5) | (6) | (7) | (8) |
|---|---|---|---|---|---|---|---|---|
| Process | Forming of interlayer insulating film | Forming of line layer | Forming of line protection layer | Forming of polyimide planarization layer | Additional annealing 1 | Additional annealing 2 | Additional annealing 3 | Additional annealing 4 |
| Heating condition | 300°C, 1 H | 240°C, 30 min | 300°C, 1 H | 270°C, 1 H | 230°C, 1 H | 200°C, 1 H | 260°C, 1 H | 250°C, 1 H |

| Process order | (1) | (2) | (3) | (4) | (5) | (6) | (7) | (8) |
|---|---|---|---|---|---|---|---|---|
| Process | Forming of interlayer insulating film | Forming of line layer | Forming of line protection layer | Forming of polyimide planarization layer | Additional annealing 1 | Additional annealing 2 | Additional annealing 3 | Additional annealing 4 |
| Heating condition | 300°C, 1 H | 240°C, 30 min | 300°C, 1 H | 270°C, 1 H | 230°C, 1 H | 200°C, 1 H | 260°C, 1 H | 250°C, 1 H |

METHOD OF MANUFACTURING THIN-FILM TRANSISTOR SUBSTRATE

CROSS REFERENCE TO RELATED APPLICATION

The present application is based on and claims priority of Japanese Patent Applications No. 2014-140843 filed on Jul. 8, 2014 and No. 2014-003761 filed on Jan. 10, 2014. The entire disclosure of the above-identified application, including the specification, drawings and claims is incorporated herein by reference in its entirety.

FIELD

One or more exemplary embodiments disclosed herein relate generally to a method of manufacturing a thin-film transistor substrate.

BACKGROUND

In an active matrix display device such as a liquid crystal display device or an organic electroluminescence (EL) display device, a thin-film transistor (TFT) is widely used as a switching element or a driving element.

Recent years have seen active research and development of TFTs using an oxide semiconductor, such as zinc oxide (ZnO), indium gallium oxide (InGaO), indium gallium zinc oxide (InGaZnO), or the like for the channel layer. For example, Patent Literature (PTL) 1 discloses a bottom-gate thin-film transistor using an oxide semiconductor. A TFT using an oxide semiconductor for the channel layer has characteristics of a small OFF current, high carrier mobility even in an amorphous state, and being able to be manufactured in a low-temperature process.

CITATION LIST

Patent Literature

[PTL 1] Japanese Patent Application No. 2008-166716

SUMMARY

Technical Problem

However, in the conventional thin-film transistor, a peak sometimes occurs in a curve indicating carrier mobility with respect to a gate voltage (hereinafter referred to as "mobility curve") around a threshold voltage (specifically, a voltage between a gate and a source where the thin-film transistor is in an ON state). With the occurrence of a peak in the mobility curve, operation of the thin-film transistor becomes unstable and unreliable.

One non-limiting and exemplary embodiment provides a method of manufacturing a thin-film transistor substrate including a highly reliable thin-film transistor.

Solution to Problem

In one general aspect, the techniques disclosed here feature a method of manufacturing a thin-film transistor substrate which includes a thin-film transistor, the method including: forming a planarization layer comprising polyimide material above the thin-film transistor; and heating the thin-film transistor at a temperature of 240° C. or lower after the planarization layer is formed.

Advantageous Effects

The method of manufacturing a thin-film transistor substrate according to one or more exemplary embodiments or features disclosed herein allows for the manufacturing of a thin-film transistor substrate including a highly reliable thin-film transistor.

BRIEF DESCRIPTION OF DRAWINGS

These and other objects, advantages and features of the invention will become apparent from the following description thereof taken in conjunction with the accompanying drawings that illustrate a specific embodiment of the present invention.

FIG. 8 is a diagram indicating an example of a heating temperature in the method of manufacturing a thin-film transistor substrate according to the embodiment.

DESCRIPTION OF EMBODIMENT

Outline of the Present Disclosure

Figure 1:
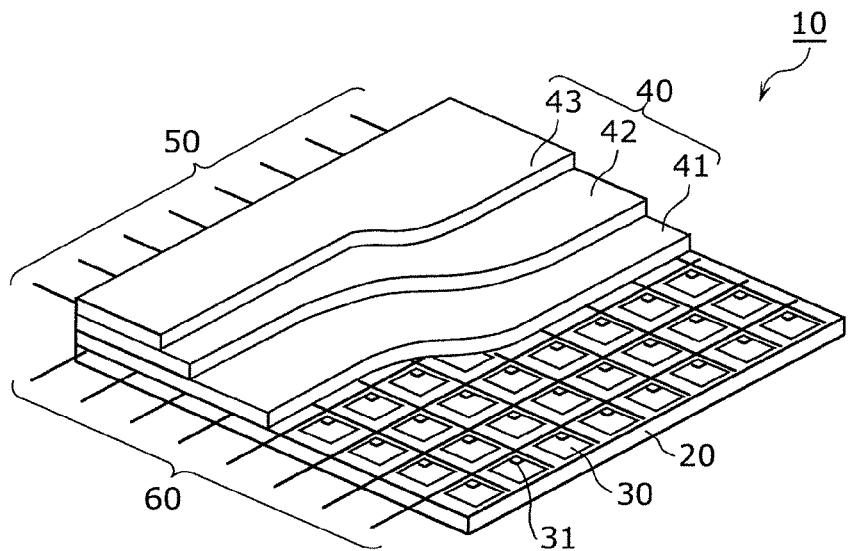
FIG. 1 is a partial cutout perspective view of an organic EL display device according to the embodiment.

The techniques disclosed here feature a method of manufacturing a thin-film transistor substrate which includes a thin-film transistor, the method including: forming a planarization layer comprising polyimide material above the thin-film transistor; and heating the thin-film transistor at a temperature of 240° C. or lower after the planarization layer is formed.

With this, by performing heating at a low temperature of 240° C. or lower, the occurrence of a peak in the mobility curve can be suppressed. For example, when the heating is performed at a high temperature before the planarization layer is formed, the peak in the mobility curve occurs. Even in this case, since the heating is performed at a low temperature of 240° C. or lower after the planarization layer is formed, the occurrence of a peak in the mobility curve can be suppressed. Accordingly, the thin-film transistor can be more reliable.

Furthermore, for example, in the method of manufacturing a thin-film transistor substrate according to an aspect of the present disclosure, in the heating, the heating may be performed at a temperature of 200° C. or higher.

With this, since heating can be performed at a temperature in a range from 200° C. to 240° C., the occurrence of a peak in the mobility curve can be suppressed appropriately.

Furthermore, for example, in the method of manufacturing a thin-film transistor substrate according to an aspect of the present disclosure, in the forming of a planarization layer, the polyimide material may be deposited and heated at a temperature of 250° C. or higher to form the planarization layer.

With this, heating the deposited polyimide material at a temperature of 250° C. or higher allows thermal curing the polyimide material, thereby forming a planarization layer having an excellent film quality. Furthermore, the baking of the planarization layer allows for suppression of diffusion of the material from the planarization layer, which allows for a reduction of impact on the film quality of a light emitting layer when the light emitting layer is formed above the planarization layer. In addition, since the low-temperature heating is performed on a thin-film transistor in which a peak in the mobility curve has occurred due to the heating at 250° C. or higher, the occurrence of a peak in the mobility curve can be suppressed.

Furthermore, for example, the method of manufacturing a thin-film transistor substrate according to an aspect of the present disclosure may further include forming a pixel electrode on the planarization layer after the heating.

With this, the heating is performed before the pixel electrode is formed, which allows suppressing the impact of heat due to the heating of an organic layer and so on deposited after the heating.

Furthermore, for example, the method of manufacturing a thin-film transistor substrate according to an aspect of the present disclosure may further include forming, above a source electrode and a drain electrode of the thin-film transistor, a line layer connected to one of the source electrode and the drain electrode, wherein in the forming of a planarization layer, the planarization layer may be formed above the line layer.

Thus, with the forming of the line layer, the flexibility on layout is improved.

Furthermore, for example, in the method of manufacturing a thin-film transistor substrate according to an aspect of the present disclosure, the thin-film transistor may comprise a semiconductor layer that is an oxide semiconductor.

With this, since the peak in the mobility curve is more likely to occur in the thin-film transistor including the oxide semiconductor as a channel layer, performing heating at 240° C. or lower allows appropriately suppressing the occurrence of the peak in the mobility curve.

Furthermore, for example, in the method of manufacturing a thin-film transistor substrate according to an aspect of the present disclosure, the oxide semiconductor may be a transparent amorphous oxide semiconductor.

Description is provided below on a thin-film transistor substrate and a method of manufacturing the same, and an embodiment of a display device including such a thin-film transistor substrate, with reference to the Drawings. It is to be noted that the embodiment described below shows a preferable specific example of the present invention. Accordingly, the numerical values, shapes, constituent elements, the arrangement and connection of the constituent elements, steps, the processing order of the steps etc., shown in the following embodiment are mere examples, and thus do not limit the present disclosure. Therefore, out of the constituent elements in the following embodiment, the constituent elements not stated in the independent claims describing the broadest concept of the present disclosure are described as optional constituent elements.

It is to be noted that each of the drawings is a schematic view and does not necessarily illustrate the real situation. It is to be noted that, in each of the drawings, substantially the same constituents are assigned with the same numerals, and the overlapping description is omitted or simplified.

Embodiment 1

[Organic EL Display Device]

Figure 2:
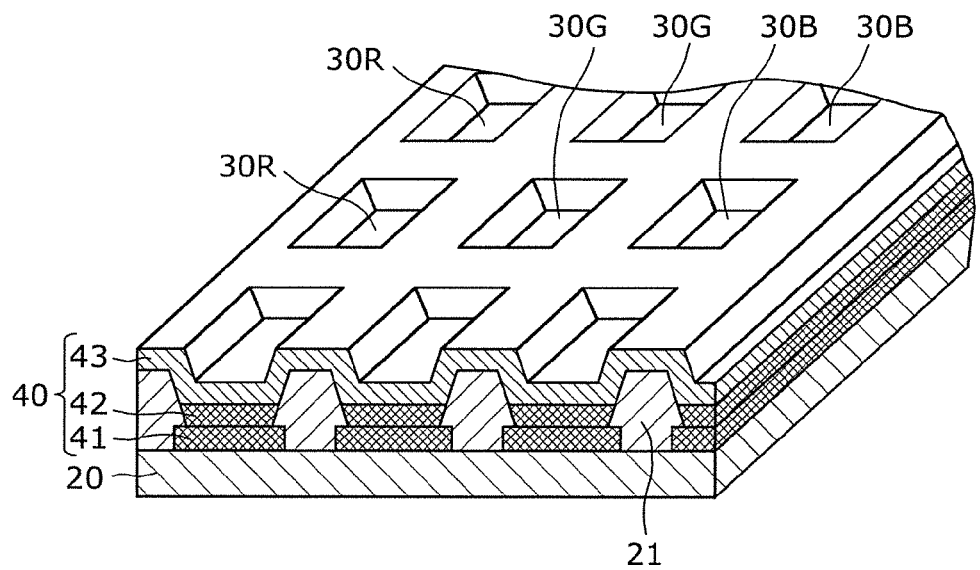
FIG. 2 is a perspective view indicating an example of a pixel bank of the organic EL display device according to the embodiment.

First, a configuration of an organic EL display device 10 according to the present embodiment is described with reference to FIG. 1 and FIG. 2. FIG. 1 is a partial cutout perspective view of the organic EL display device 10 according to the present embodiment. FIG. 2 is a perspective view indicating an example of a pixel bank of the organic EL display device 10 according to the present embodiment.

As shown in FIG. 1, the organic EL display device 10 is a layered structure of (i) a TFT substrate (TFT array substrate) 20 in which plural thin-film transistors are arranged and (ii) an organic EL element (light emitting unit) 40 comprising an anode 41 which is a lower electrode, an EL layer 42 which is a light-emitting layer comprising organic material, and a cathode 43 which is a transparent upper electrode.

Plural pixels 30 are arranged in a matrix in the TFT substrate 20, and a pixel circuit 31 is provided for each pixel 30.

The organic EL element 40 is formed for each of the pixels 30, and the light emission of each organic EL element 40 is controlled by the pixel circuit 31 provided for each of the pixels 30. The organic EL element 40 is formed on an interlayer insulating film (planarization layer) formed so as to cover the plural thin-film transistors.

Furthermore, the organic EL element 40 includes the EL layer 42 placed between the anode 41 and the cathode 43. A hole transport layer is further stacked between the anode 41 and the EL layer 42, and an electron transport layer is further stacked between the EL layer 42 and the cathode 43. It is to be noted that other organic function layer may be provided between the anode 41 and the cathode 43.

Each pixel 30 is driven by a corresponding one of the pixel circuits 31. Furthermore, the TFT substrate 20 includes: plural gate lines (scanning lines) 50 which are arranged along a row direction of the pixel 30; plural source lines (signal lines) 60 which are arranged along a column direction of the pixel 30 so as to cross the gate lines 50; and plural power lines (not illustrated in FIG. 1) which are arranged parallel to the source lines 60. Each pixel 30 is partitioned by a gate line 50 and a source line 60 orthogonal to each other, for example.

For each row, one of the gate lines 50 is connected to respective gate electrodes of thin-film transistors each of which operates as a switching element included in the respective pixel circuits 31 in that row. For each column, one of the source lines 60 is connected to respective source electrodes of the thin-film transistors each of which operates as a switching element included in the respective pixel circuits 31 in that column. For each column, one of the power lines is connected to respective drain electrodes of the thin-film transistors each of which operates as a drive element included in the respective pixel circuits 31 in that column.

As shown in FIG. 2, each of the pixels 30 of the organic EL display 10 includes subpixels 30R, 30G, and 30B of three colors (red color, green color, and blue color). Plural subpixels 30R, 30G, and 30B are formed so as to form plural matrices on the display surface. The subpixels 30R, 30G, and 30B, are separated from each other by banks 21.

The banks 21 are formed such that protrusions running parallel to the gate lines 50 and protrusions running parallel to the source lines 60 cross each other. In addition, the subpixels 30R, 30G, and 30B correspond to the parts surrounded by these protrusions (that is, in the openings formed by the banks 21) one by one. It is to be noted that the pixel bank used as the bank 21 in the present embodiment may be a line bank.

The anode 41 is formed, for each of the subpixels 30R, 30G, and 30B, on the interlayer insulating film (planarization layer) on the TFT substrate 20 and inside the openings formed by the banks 21. In the same manner, the EL layer 42 is formed on the anodes 41 and inside the openings formed by the banks 21, for each of the subpixels 30R, 30G, and 30B. The transparent cathode 43 is formed continuously on plural banks 21 so as to cover the entire EL layer 42 (all of the subpixels 30R, 30G, and 30B).

In addition, the pixel circuit 31 is provided for each of the subpixels 30R, 30G, and 30B. Each of the subpixels 30R, 30G, and 30B is electrically connected to the corresponding pixel circuit 31 via a contact hole and a relay electrode. It is to be noted that, except for the difference in the color of emitted light of the EL layers 42, the subpixels 30R, 30G, and 30B have the same configuration.

Figure 3:
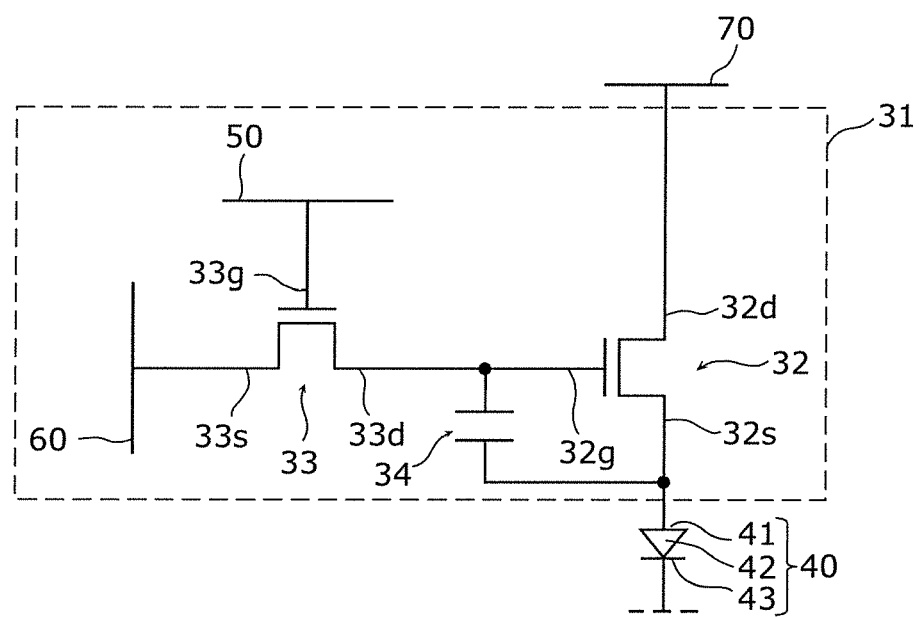
FIG. 3 is an electric circuit diagram indicating a configuration of a pixel circuit in the organic EL display device according to the embodiment.

Here, a circuit configuration of the pixel circuit 31 of the pixel 30 is described with reference to FIG. 3. FIG. 3 is an electric circuit diagram indicating a configuration of the pixel circuit 31 in the organic EL display device 10 according to the present embodiment.

As shown in FIG. 3, the pixel circuit 31 includes a thin-film transistor 32 which operates as a drive element; a thin-film transistor 33 which operates as a switching element; and a capacitor 34 which stores data to be displayed in the corresponding pixel 30. In the present embodiment, the thin-film transistor 32 is a drive transistor for driving the organic EL element 40, and the thin-film transistor 33 is a switching transistor for selecting a pixel 30.

The thin-film transistor 32 includes: a gate electrode 32g connected to a first end of the capacitor 34 and the drain electrode 33d of the thin-film transistor 33; a drain electrode 32d connected to the power line 70; a source electrode 32s connected to a second end of the capacitor 34 and the anode 41 of the organic EL element 40; and a semiconductor film (not illustrated in FIG. 3). The thin-film transistor 32 supplies a current corresponding to a data voltage held by the capacitor 34 from the power line 70 via the source electrode 32s to the anode 41 of the organic EL element 40. With this, at the organic EL element 40, a driving current flows from the anode 41 to the cathode 43 and the EL layer 42 emits light.

The thin-film transistor 33 includes: a gate electrode 33g connected to the gate line 50; a source electrode 33s connected to the source line 60; a drain electrode 33d connected to the first end of the capacitor 34 and the gate electrode 32g of the thin-film transistor 32; and a semiconductor film (not illustrated in FIG. 3). When a predetermined voltage is applied to the gate line 50 and the source line 60 to which the thin-film transistor 33 is connected, the voltage applied to the source line 60 is stored, as data voltage, in the capacitor 34.

It is to be noted that the organic EL display unit 10 having the above-described configuration adopts the active matrix method in which display control is performed for each pixel 30 located at respective cross points of the gate lines 50 and the source lines 60. With this, the thin-film transistors 32 and 33 of each pixel 30 (each subpixel 30R, 30G, and 30B) cause the corresponding organic EL element 40 to selectively emit light, to display the desired image.

[Thin-Film Transistor]

Hereinafter, description is provided on the thin-film transistor according to the present embodiment, with reference to FIG. 4. It is to be noted that the thin-film transistor according to the present embodiment is a bottom-gate type and a channel-protection type thin-film transistor.

Figure 4:
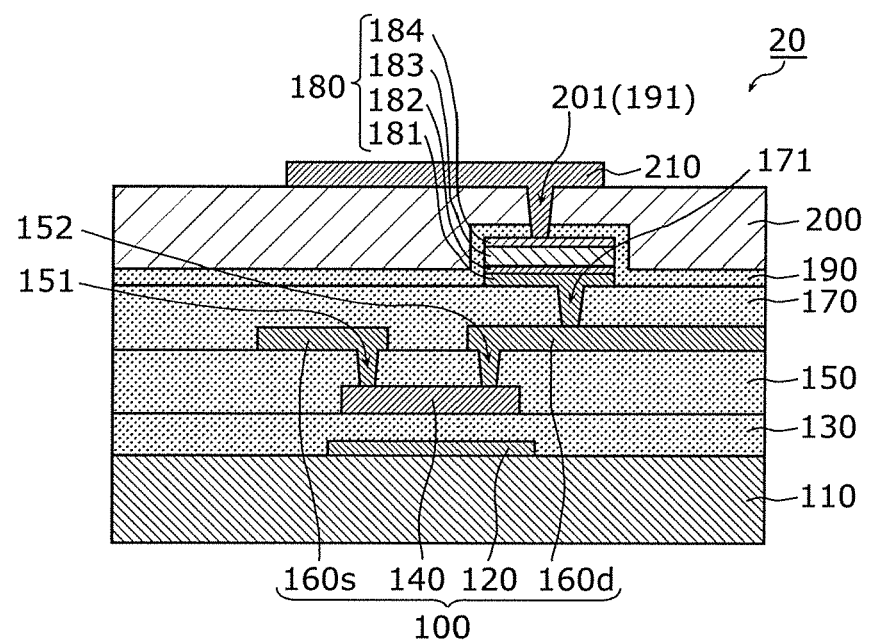
FIG. 4 is a schematic cross-sectional view indicating an example of the thin-film transistor substrate according to the embodiment.

FIG. 4 is a schematic cross-sectional view of the TFT substrate 20 according to the present embodiment.

As illustrated in FIG. 4, the TFT substrate 20 according to the present embodiment includes a substrate 110, a gate electrode 120, a gate insulating layer 130, an oxide semiconductor layer 140, a channel protection layer 150, a source electrode 160s, a drain electrode 160d, an interlayer insulating layer 170, a line layer 180, a line protection layer 190, a planarization layer 200, and a pixel electrode 210. It is to be noted that, in the TFT substrate 20, the thin-film transistor 100 includes the gate electrode 120, the gate insulating layer 130, the oxide semiconductor layer 140, the channel protection layer 150, the source electrode 160s, and the drain electrode 160d.

The thin-film transistor 100 is the thin-film transistor 32 illustrated in FIG. 3, for example. Specifically, the thin-film transistor 100 can be used as a drive transistor. Specifically, when the thin-film transistor 100 is the thin-film transistor 32 (drive transistor), the gate electrode 120 corresponds to the gate electrode 32g, the source electrode 160s corresponds the source electrode 32s, and the drain electrode 160d corresponds to the drain electrode 32d.

The thin-film transistor 100 may be the thin-film transistor 33 illustrated in FIG. 3, for example. Specifically, the thin-film transistor 100 may be used as a switching transistor.

The substrate 110 is a substrate comprising electrically insulating material. For example, the substrate 110 is a substrate comprising: a glass material such as alkalifree glass, silica glass, and high heat resistance glass; a resin material such as polyethylene, polypropylene, and polyimide; a semiconductor material such as silicon and gallium arsenide; and a metal material such as stainless coated by an insulating layer.

It is to be noted that the substrate 110 may be a flexible substrate such as a resin substrate. In this case, it is possible to use the thin-film transistor 100 for a flexible display and so on.

The gate electrode 120 is formed on the substrate 110 in a predetermined shape. The gate electrode 120 has a film thickness of from 20 nm to 500 nm, for example. It is to be noted that the gate electrode 120 may be formed above the substrate 110 via a buffer layer, for example.

The gate electrode 120 is an electrode comprising a conductive material. For example, the material for the gate electrode 120 may include: metal such as molybdenum, aluminum, copper, tungsten, titanium, manganese, chrome, tantalum, niobium, silver, gold, platinum, palladium, indium, nickel, neodymium; a metal alloy; conductive metal oxide such as indium tin oxide (ITO), aluminum doped zinc oxide (AZO), gallium doped zinc oxide (GZO); and conductive polymer such as polythiophene and polyacetylene. Furthermore, the gate electrode 120 may have a multilayer structure obtained by stacking these materials.

The gate insulating layer 130 is formed between the gate electrode 120 and the oxide semiconductor layer 140. Specifically, the gate insulating layer 130 is formed on the gate electrode 120 and the substrate 110 so as to cover the gate electrode 120. The gate insulating layer 130 has a film thickness of from 50 nm to 300 nm, for example.

The gate insulating layer 130 comprises an electrically insulating material. For example, the gate insulating layer 130 is a single-layered film of a silicon oxide film, a silicon nitride film, a silicon oxynitride film, an aluminum oxide film, a tantalum oxide film, a hafnium oxide film, and so on, or a multi-layered film of the above.

The oxide semiconductor layer 140 is formed above the substrate 110 to face the gate electrode 120. The oxide semiconductor layer 140 is a channel layer of the thin-film transistor 100. Specifically, the oxide semiconductor layer 140 is formed at a position facing the gate electrode 120 and on the gate insulating layer 130. For example, the oxide semiconductor layer 140 is formed, above the gate electrode 120, in an island shape and on the gate insulating layer 130. The oxide insulating layer 140 has a film thickness of from 20 nm to 200 nm, for example.

The material for the oxide semiconductor layer 140 may include an oxide semiconductor material including at least one of indium (In), gallium (Ga), and Zinc (Zn). For example, the oxide semiconductor layer 140 comprises a transparent amorphous oxide semiconductor (TAOS) such as an amorphous indium gallium zinc oxide (InGaZnO: IGZO). The proportion of In:Ga:Zn is approximately 1:1:1, for example. Furthermore, the proportion of In:Ga:Zn may be 0.8-1.2:0.8-1.2:0.8-1.2. However, this is not an only example.

It is to be noted that the thin-film transistor comprising a channel layer including a transparent amorphous oxide semiconductor has high carrier mobility and thus is suitable for a large-screen and high-definition display device. Furthermore, the transparent amorphous oxide semiconductor can be deposited by a low temperature, and thus can be easily formed on a flexible substrate such as plastic or film.

The channel protection layer 150 is formed on the oxide semiconductor layer 140. For example, the channel protection layer 150 is formed on the oxide semiconductor layer 140 and the gate insulating layer 130 so as to cover the oxide semiconductor layer 140. The channel protection layer 150 is a protection layer that protects the oxide semiconductor layer 140. The channel protection layer 150 has a film thickness of from 50 nm to 500 nm, for example.

The channel protection layer 150 comprises an electrically conductive material. For example, the channel protection layer 150 is: a single-layered film of a film comprising an inorganic material, such as a silicon oxide film, a silicon nitride film, a silicon oxynitride film, and an aluminum oxide film; a single-layered film comprising an inorganic material including silicon, oxygen, and carbon; or a multi-layered film of the above.

Furthermore, a part of the channel protection layer 150 is opened to be penetrated. In other words, the channel protection layer 150 has contact holes 151 and 152 for partially exposing the oxide semiconductor layer 140.

The contact hole 151 is a contact hole for exposing a source contact region of the oxide semiconductor layer 140 to electrically connect the source electrode 160s and the oxide semiconductor layer 140. The material included in the source electrode 160s extends along the wall surface of the contact hole 151 to reach the oxide semiconductor layer 140, for example. Alternatively, the contact hole 151 may be filled with the material included in the source electrode 160s.

The contact hole 152 is a contact hole for exposing a drain contact region of the oxide semiconductor layer 140 to electrically connect the drain electrode 160d and the oxide semiconductor layer 140. The material included in the drain electrode 160d extends along the wall surface of the contact hole 152 to reach the oxide semiconductor layer 140, for example. Alternatively, the contact hole 152 may be filled with the material included in the drain electrode 160d.

The source electrode 160s and the drain electrode 160d are formed on the channel protection layer 150 in a predetermined shape. For example, the source electrode 160s and the drain electrode 160d are arranged on the channel protection layer 150 to face each other with an interval in a substrate horizontal direction. Specifically, the source electrode 160s and the drain electrode 160d are formed on the channel protection layer 150 to be connected to the oxide semiconductor layer 140 via the contact hole 151 and the contact hole 152, respectively. The source electrode 160s and the drain electrode 160d have a film thickness of from 100 nm to 500 nm, for example.

The source electrode 160s and the drain electrode 160d are electrodes comprising a conductive material. The material for the source electrode 160s and the drain electrode 160d may be the same as that used for the gate electrode 120, for example.

The interlayer insulating layer 170 is formed above the channel protection layer 150. The interlayer insulating layer 170 is formed on the channel protection layer 150, the source electrode 160s, and the drain electrode 160d. For example, the interlayer insulating layer 170 is formed on the channel protection layer 150, the source electrode 160s, and the drain electrode 160d, so as to cover the source electrode 160s and the drain electrode 160d. The interlayer insulating layer 170 also serves as a protection layer which protects the source electrode 160s and the drain electrode 160d. The interlayer insulating layer 170 has a film thickness of from 100 nm to 800 nm, for example.

The interlayer insulating layer 170 comprises an electrically insulating material. For example, the interlayer insulating layer 170 is: a single-layered film of a film comprising an inorganic material, such as a silicon oxide film, a silicon nitride film, a silicon oxynitride film, and an aluminum oxide film; a single-layered film of a film comprising an inorganic material such as silicon, oxygen, and carbon; or a multi-layered film of the above.

Furthermore, a part of the interlayer insulating layer 170 is opened to be penetrated. In other words, the interlayer insulating layer 170 has a contact hole 171 for partially exposing the drain electrode 160d.

The contact hole 171 is a contact hole formed for electrically connecting the line layer 180 and the drain electrode 160d. The material included in the line layer 180 extends along the wall surface of the contact hole 171 to reach the drain electrode 160d, for example. Alternatively, the contact hole 171 may be filled with the material included in the drain electrode 160d.

The line layer 180 is formed in a predetermined shape above the source electrode 160s and the drain electrode 160d. The line layer 180 is connected to one of the source electrode 160s and the drain electrode 160d. Specifically, the line layer 180 is electrically connected to the drain electrode 160d via the contact hole 171.

The line layer 180 has, as illustrated in FIG. 4, a layered structure including a first layer 181, a second layer 182, a third layer 183, and a fourth layer 184.

The first layer 181 is formed in a predetermined shape on the interlayer insulating layer 170 and is connected to the drain electrode 160d. The first layer 181 comprises a conductive material. For example, the first layer 181 is a transparent conductive film, and specifically, comprises indium tin oxide (ITO). The first layer 181 has a film thickness of 50 nm, for example.

The second layer 182 is formed in a predetermined shape on the first layer 181. The second layer 182 comprises a conductive material. For example, the second layer 182 is a molybdenum film (Mo film). The second layer 182 has a film thickness of 20 nm, for example.

The third layer 183 is formed in a predetermined shape on the second layer 182. The third layer 183 comprises a conductive material. For example, the third layer 183 is a copper film (Cu film). The third layer 183 has a film thickness of 375 nm, for example.

The fourth layer 184 is formed in a predetermined shape on the third layer 183. The fourth layer 184 comprises a conductive material. For example, the fourth layer 184 is a copper manganese alloy film (CuMn alloy film). The fourth layer 184 has a film thickness of 65 nm, for example.

The line protection layer 190 is formed on the line layer 180. Specifically, the line protection layer 190 is formed on the line layer 180 and the interlayer insulating layer 170 so as to cover the line layer 180. The line protection layer 190 is a protection layer that protects the line layer 180. The line protection layer 190 has a film thickness of 100 nm, for example.

The line protection layer 190 comprises an electrically insulating material. For example, the line protection layer 190 is: a single-layered film of a film comprising an inorganic material, such as a silicon oxide film, a silicon nitride film, a silicon oxynitride film, and an aluminum oxide film; a single-layered film of a film comprising an inorganic material such as silicon, oxygen, and carbon; or a multi-layered film of the above.

Furthermore, a part of the line protection layer 190 is opened to be penetrated. In other words, the line protection layer 190 has a contact hole 191 for partially exposing the line layer 180 (the fourth layer 184).

The planarization layer 200 is formed above the thin-film transistor 100, specifically, above the source electrode 160s and the drain electrode 160d. Specifically, the planarization layer 200 is formed on the line protection layer 190. The planarization layer 200 planarizes an upper surface of the thin-film transistor 100. In other words, the top surface of the planarization layer 200 is flat. The planarization layer 200 has a film thickness of 4 µm, for example.

The planarization layer 200 comprises an electrically insulating material. The planarization layer 200 comprises a polyimide material. For example, the planarization layer 200 comprises a photosensitive polyimide resin material.

Furthermore, a part of the planarization layer 200 is opened to be penetrated. In other words, the planarization layer 200 has a contact hole 201 continuous to the contact hole 191.

The contact holes 201 and 191 are contact holes formed for electrically connecting the line layer 180 and the pixel electrode 210. The material included in the pixel electrode 210 extends along the wall surface of the contact holes 201 and 191 to reach the line layer 180, for example. Alternatively, the contact holes 201 and 191 may be filled with the material included in the pixel electrode 210.

The pixel electrode 210 is formed in a predetermined shape on the planarization layer 200. The pixel electrode 210 is an anode (the anode 41 illustrated in FIG. 1) of the organic EL element formed above the thin-film transistor 100, for example.

The pixel electrode 210 is an electrode comprising a conductive material. The pixel electrode 210 comprises metal such as aluminum, silver, and so on.

It is to be noted that the organic EL display device 10 according to the present embodiment further includes an organic EL element 40 including an organic light emitting layer formed above the planarization layer 200. Specifically, as illustrated in FIG. 1, the TFT substrate 20 includes an EL layer 42 (a hole injection layer, a hole transport layer, an organic light emitting layer, an electron transport layer, and an electron injection layer), and a cathode 43, which are stacked on the pixel electrode 210 in this order.

[Method of Manufacturing Thin-Film Transistor]

Next, a method of manufacturing a thin-film transistor according to the present embodiment is described with reference to FIG. 5A to FIG. 5D. FIG. 5A to FIG. 5D are each a schematic cross-sectional view illustrating the method of manufacturing the TFT substrate 20 according to the present embodiment.

Figure 5A:
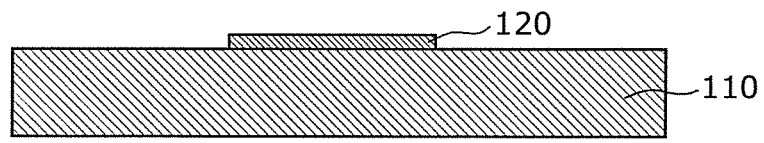
FIG. 5A is a schematic cross-sectional view indicating a method of manufacturing a thin-film transistor substrate according to the embodiment.
Figure 5A:
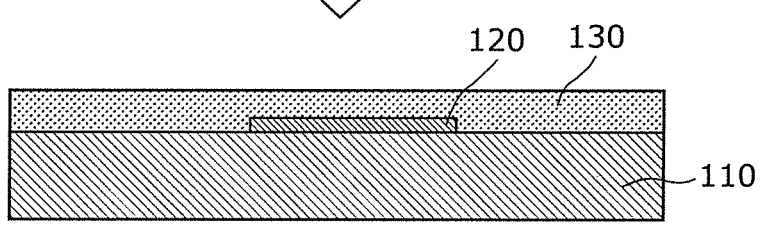
Figure 5A:
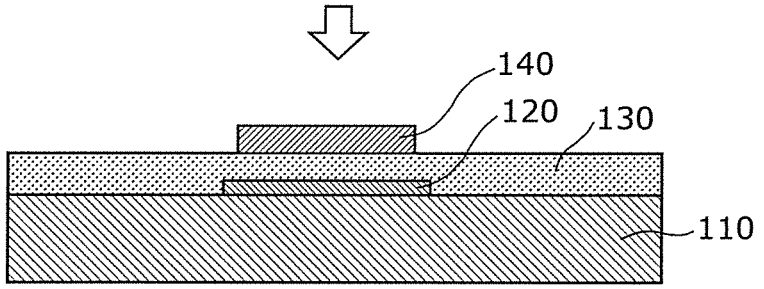
Figure 5A:
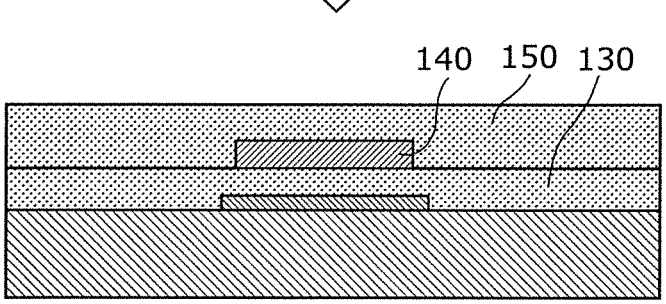

First, as illustrated in (a) in FIG. 5A, a substrate 110 is prepared and a gate electrode 120 in a predetermined shape is formed above the substrate 110. For example, a metal film is deposited on the substrate 110 by sputtering and the metal film is processed through photo lithography and etching, to form the gate electrode 120 in the predetermined shape.

Specifically, first, a glass substrate is prepared as the substrate 110, and a Mo film and a Cu film are deposited on the substrate 110 in order by sputtering. Then, the Mo film and the Cu film are subjected to patterning through photo lithography and wet etching, to form the gate electrode 120. It is to be noted that the wet etching of the Mo film and the Cu film can be performed by chemical solution which is obtained by mixing hydrogen peroxide water ($H_2O_2$) and organic acid.

Next, as illustrated in (b) in FIG. 5A, the gate insulating layer 130 is formed above the substrate 110. For example, plasma chemical vapor deposition (CVD) is performed to deposit the gate insulating layer 130 so as to cover the gate electrode 120.

Specifically, the gate insulating layer 130 is formed by depositing a silicon nitride film and a silicon oxide film on the substrate 110 in order by plasma CVD, so as to cover the gate electrode 120. For example, the silicon nitride film can be deposited using, as introduced gas, silane gas ($SiH_4$), ammonia gas ($NH_3$), and nitrogen gas ($N_2$). For example, the silicon oxide film can be deposited using, as introduced gas, silane gas ($SiH_4$) and nitrous oxide gas ($N_2O$).

Next, as illustrated in (c) in FIG. 5A, an oxide semiconductor layer 140 in a predetermined shape is formed above the substrate 110 and at a position facing the gate electrode 120. For example, the oxide semiconductor film is deposited on the gate insulating layer 130 by sputtering. Then, the oxide semiconductor layer 140 in the predetermined shape is formed by processing the oxide semiconductor film by photo lithography and etching.

Specifically, sputtering is performed in mixed gas atmosphere of oxygen ($O_2$) and argon (Ar) and using a target material having composition ratio of In:Ga:Zn=1:1:1, to deposit an amorphous InGaZnO film on the gate insulating layer 130. Then, the amorphous InGaZnO deposited on the gate insulating layer 130 is subjected to wet etching, to form the oxide semiconductor layer 140. The wet etching of InGaZnO can be performed using chemical solution which is obtained by mixing phosphoric acid ($H_3PO_4$), nitric acid ($HNO_3$), acetic acid ($CH_3COOH$), and the water, for example.

Next, as illustrated in (d) in FIG. 5A, a channel protection layer 150 is formed on the gate insulating layer 130 so as to cover the oxide semiconductor layer 140. For example, the channel protection layer 150 is formed by depositing a silicon oxide film on the entire surface by plasma CVD. For example, the silicon oxide film has a thickness of from 50 nm to 500 nm. For example, the silicon oxide film can be deposited using, as introduced gas, silane gas ($SiH_4$) and nitrous oxide gas ($N_2O$).

Figure 5B:
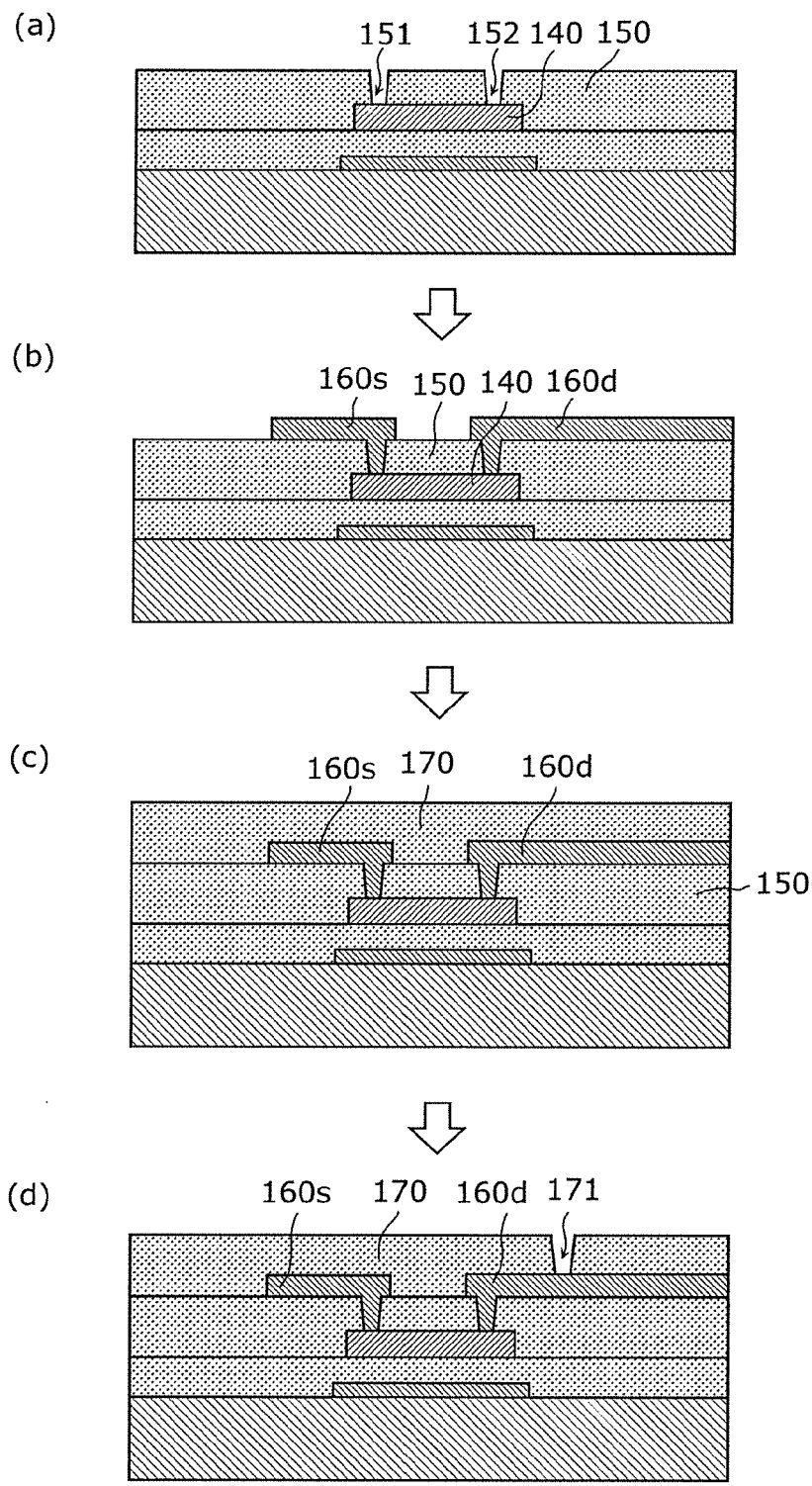
FIG. 5B is a schematic cross-sectional view indicating the method of manufacturing a thin-film transistor substrate according to the embodiment.

Next, as illustrated in (a) in FIG. 5B, a part of the channel protection layer 150 is removed by etching to form contact holes which are 151 and 152 for making the oxide semiconductor layer 140 contact the source electrode 160s and the drain electrode 160d. Specifically, the contact holes 151 and 152 are formed by photo lithography and etching so as to partially expose the oxide semiconductor layer 140.

For example, when the channel protection layer 150 is a silicon oxide film, reactive ion etching (RIE) can be adopted as the dry etching. In this case, as etching gas, carbon tetrafluoride ($CF_4$) and oxygen gas ($O_2$) can be used, for example. Parameters such as gas flow rate, pressure, applied power, and frequency, are set as appropriate according to the size of the substrate, a film thickness to be etched, and so on.

Next, as illustrated in (b) in FIG. 5B, the source electrode 160s and the drain electrode 160d in predetermined shapes are formed as electrodes connected to the oxide semiconductor layer 140.

Specifically, a Cu film is deposited on the channel protection layer 150 by sputtering so as to plug the contact holes 151 and 152 of the channel protection layer 150. After that, the Cu film is processed by photo lithography and etching to form the source electrode 160s and the drain electrode 160d in the predetermined shapes. For example, the wet etching of the Cu film can be performed using a chemical solution which is obtained by mixing hydrogen peroxide water ($H_2O_2$) and organic acid.

Next, as illustrated in (c) in FIG. 5B, an interlayer insulating film 170 is deposited so as to cover the source electrode 160s and the drain electrode 160d. For example, the interlayer insulating layer 170 is formed by depositing, by sputtering and plasma CVD, a silicon oxide film having a film thickness of 200 nm, an aluminum oxide film having a film thickness of 30 nm, a silicon oxide film having a film thickness of 200 nm, a silicon nitride film having a film thickness of 100 nm, in order.

For example, the silicon oxide film can be deposited by plasma CVD using, as introduced gas, silane gas ($SiH_4$) and nitrous oxide gas ($N_2O$). For example, the oxide aluminum film can be deposited, using aluminum as the target, by sputtering in mixed gas atmosphere of oxygen ($O_2$) and argon (Ar). For example, the silicon nitride film can be deposited using, as introduced gas, silane gas ($SiH_4$), ammonia gas ($NH_3$), and nitrogen gas ($N_2$).

After the silicon nitride film for the upper layer is formed, heating (annealing) is performed under conditions of 300° C. and one hour, for example. With this, the resistance of the oxide semiconductor layer 140 can be increased.

Next, as illustrated in (d) in FIG. 5B, a part of the interlayer insulating film 170 is removed by etching to form the contact hole 171 so as to expose one of the source electrode 160s and the drain electrode 160d. Specifically, the contact hole 171 is formed in the interlayer insulating film 170 by photo lithography and etching so as to partially expose the drain electrode 160d.

For example, the silicon oxide film and the silicon nitride film are etched through dry etching using the RIE. In this case, as etching gas, carbon tetrafluoride ($CF_4$) and oxygen gas ($O_2$) can be used, for example. Parameters such as gas flow rate, pressure, applied power, and frequency, are set as appropriate according to the size of the substrate, the film thickness to be etched, and so on.

The aluminum oxide film is, for example, etched through wet etching using alkaline solution. The wet etching of the aluminum oxide film can be performed using potassium hydroxide (KOH), for example.

Figure 5C:
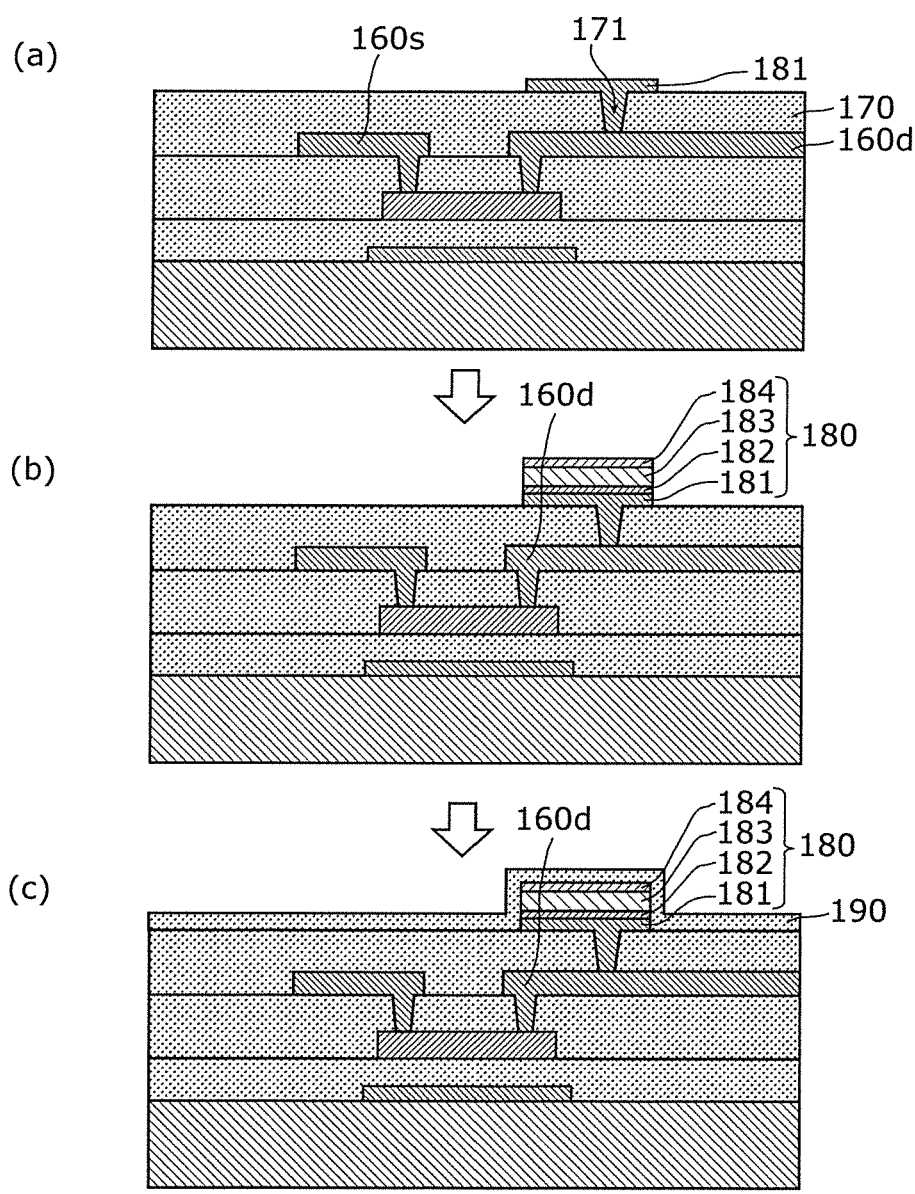
FIG. 5C is a schematic cross-sectional view indicating the method of manufacturing a thin-film transistor substrate according to the embodiment.

Next, in the order as illustrated in (a) and (b) in FIG. 5C, above the source electrode 160s and the drain electrode 160d, the line layer 180 connected to one of the source electrode 160s and the drain electrode 160d is formed. Specifically, the line layer 180 is formed to be connected to the exposed drain electrode 160d via the contact hole 171.

First, as illustrated in (a) in FIG. 5C, a first layer 181 in a predetermined shape is formed so as to be connected to one of the source electrode 160s and the drain electrode 160d. Specifically, an ITO film is deposited on the interlayer insulating layer 170 by sputtering so as to plug the contact hole 171 of the interlayer insulating layer 170. After that, by processing the ITO film by photo lithography and etching, the first layer 181 in the predetermined shape is formed. The ITO film is etched through wet etching using oxalic-acid-series chemical solution.

After the first layer 181 is formed, heating (baking) is performed under conditions of 240° C. and 30 minutes. With this, the resistance of the ITO film can be decreased.

Next, as illustrated in (b) in FIG. 5C, on the first layer 181, a second layer 182, a third layer 183, and a fourth layer 184, in predetermined shapes, are formed in order. Specifically, a Mo film, a Cu film, and a CuMn film are deposited in order by sputtering so as to cover the first layer 181. After that, the Mo film, the Cu film, and the CuMn film are processed through photo lithography and etching, to form the second layer 182, the third layer 183, and the fourth layer 184 in the predetermined shapes. It is to be noted that the Mo film, the Cu film, and the CuMn film are etched through wet etching using a chemical solution which is obtained by mixing hydrogen peroxide water ($H_2O_2$) and organic acid.

Next, as illustrated in (c) in FIG. 5C, a line protection layer 190 is formed so as to cover the line layer 180. For example, the line protection layer 190 is formed by depositing the silicon nitride film having a film thickness of 100 nm by plasma CVD.

After the line protection layer 190 is formed, heating (annealing) is performed under conditions of 300° C. and one hour, for example. With this, the resistance of the oxide semiconductor layer 140 can be increased.

Figure 5D:
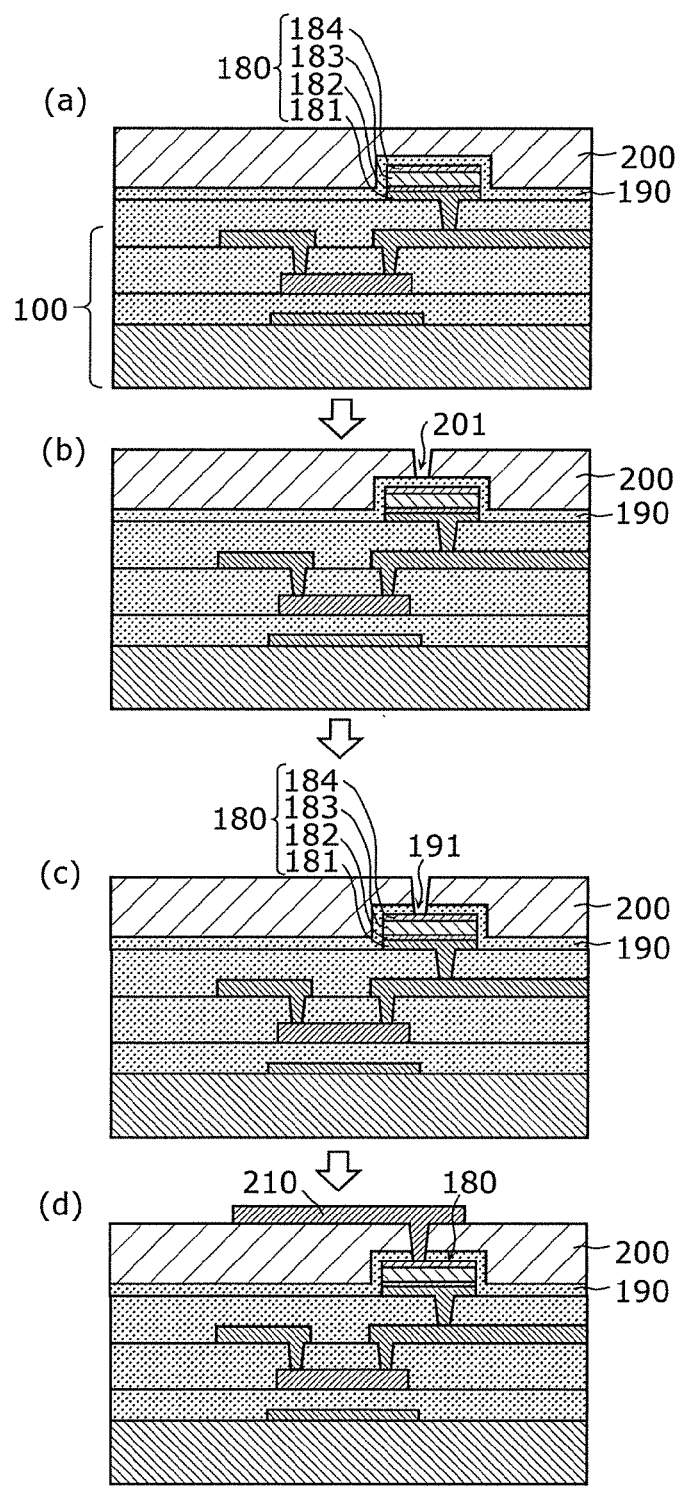
FIG. 5D is a schematic cross-sectional view indicating the method of manufacturing a thin-film transistor substrate according to the embodiment.

Next, as illustrated in (a) in FIG. 5D, a planarization layer 200 comprising a polyimide material is formed above the thin-film transistor 100. Specifically, the planarization layer 200 is formed above the line layer 180. More specifically, the planarization layer 200 is formed on the line protection layer 190. For example, a photosensitive resin comprising the polyimide material is applied on the line protection layer 190. After the application, heating (pre-baking) is performed at a temperature of 120° C.

Next, as illustrated in (b) in FIG. 5D, a part of the planarization layer 200 is removed to form a contact hole 201 so as to partially expose the line protection layer 190. Specifically, the contact hole 201 is formed by performing exposing and developing.

After the polyimide material is deposited, heating is performed at a temperature of 250° C. or higher. For example, after the contact hole 201 is formed, heating is performed under conditions of 270° C. and one hour. With this, the polyimide material is thermally cured. Specifically, residual solvent is vaporized. With this, the planarization layer 200 is formed.

Next, as illustrated in (c) in FIG. 5D, a part of the line protection layer 190 is removed by etching using the planarization layer 200 as a mask, to form a contact hole 191 so as to partially expose the line layer 180 (the fourth layer 184).

For example, when the line protection layer 190 is a silicon nitride film, RIE can be adopted as the dry etching. In this case, as etching gas, carbon tetrafluoride ($CF_4$) and oxygen gas ($O_2$) can be used, for example. Parameters such as gas flow rate, pressure, applied power, and frequency, are set as appropriate according to the size of the substrate, the film thickness to be etched, and so on.

The present embodiment includes, after the planarization layer 200 is formed, heating the planarization layer 200 with a temperature of 240° C. or lower. Specifically, after the planarization layer 200 is formed, heating is performed with a temperature in a range from 200° C. to 240° C. (hereinafter referred to as "low-temperature annealing"). For example, the low temperature annealing is performed before the pixel electrode 210 is formed. The details and advantageous effect of the heating are described with reference to FIG. 8 and FIG. 9 later.

Next, as illustrated in (d) in FIG. 5D, a pixel electrode 210 is formed on the planarization layer 200 after the heating. Specifically, the pixel electrode 210 in a predetermined shape and to be connected to the line layer 180 is formed on the planarization layer 200. The pixel electrode 210 is an anode (the anode 41 illustrated in FIG. 5D) of the organic EL element formed above the planarization layer 200, for example.

Specifically, an aluminum film (Al film) is deposited on the planarization layer 200 by sputtering so as to plug the contact hole 201 of the planarization layer 200 and the contact hole 191 of the line protection layer 190. After that, by processing the Al film by photo lithography and etching, the pixel electrode 210 in the predetermined shape is formed. The Al film is etched through wet etching using a chemical solution which is obtained by mixing phosphoric acid ($H_3PO_4$), nitric acid ($HNO_3$), acetic acid ($CH_3COOH$), and the water, for example.

As described above, the TFT substrate 20 illustrated in FIG. 4 can be manufactured.

It is to be noted that, above the planarization layer 200, an organic EL element (the organic EL element 40 illustrated in FIG. 1) is formed, for example. Specifically, on the pixel electrode 210, an EL layer 42 (a hole injection layer, a hole transport layer, an organic light emitting layer, an electron transport layer, and an electron injection layer) and a cathode 43 are stacked in order. With this, the organic EL display device 10 illustrated in FIG. 1 can be manufactured.

[Relationship Between Carrier Mobility and Presence of Peak in Mobility Curve]

Description is provided below on the relationship between the carrier mobility μ and presence of a peak in a mobility curve, with reference to FIG. 6 and FIG. 7.

Figure 6:
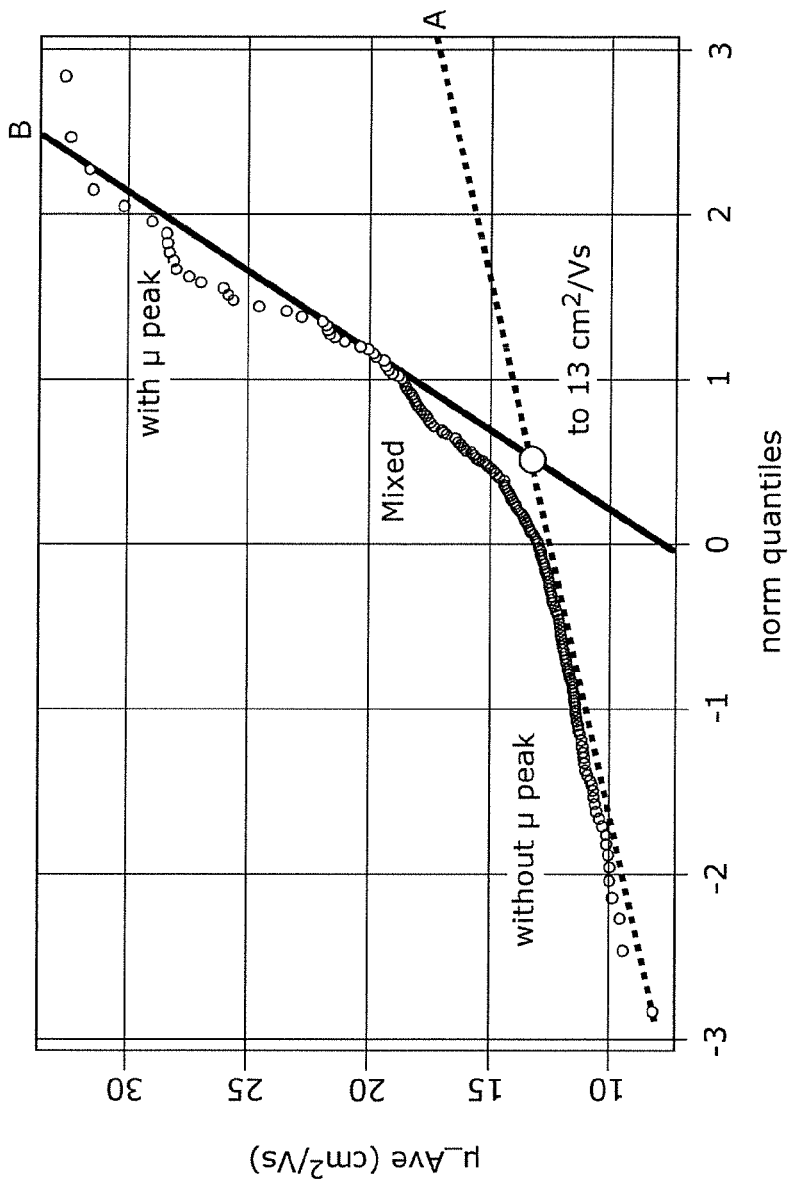
FIG. 6 is a diagram indicating a normal probability plot of carrier mobility according to the embodiment.

FIG. 6 is a diagram indicating a normal probability plot of carrier mobility according to the present embodiment. Specifically, FIG. 6 indicates a normal probability plot created by manufacturing plural lots for a TFT substrate including plural thin-film transistors and calculating an average value of the carrier mobility of each thin-film transistor per substrate.

Here, the targeted thin-film transistor is of bottom-gate type and channel protection type, and includes an amorphous InGaZnO film as a semiconductor layer. In other words, the targeted thin-film transistor is the thin-film transistor 100 manufactured by the manufacturing method illustrated in FIG. 5A to FIG. 5D. Furthermore, the lot indicates a production unit, and a single lot includes plural TFT substrates manufactured at the same time.

The vertical axis in FIG. 6 indicates an average value (unit: $cm^2/Vs$) of the carrier mobility μ. Specifically, the average value of the carrier mobility μ is a value obtained by measuring a drain current $I_d$ under conditions of a source potential $V_s=0$, a gate potential $V_g=-20V$ to $+20V$, and a drain potential $V_d=4.1V$ and calculating a carrier mobility μ using (Equation 1) below, for each thin-film transistor, and averaging the calculated μ for each TFT substrate.

[Math 1]

$$\mu = \left(\frac{d\sqrt{I_d}}{dV_g}\right)^2 \cdot \frac{2L}{WC_{ox}} \quad \text{(Equation 1)}$$

It is to be noted that, in (Equation 1), L indicates a channel length, W indicates a channel width, and $C_{ox}$ indicates a capacitance value of the gate insulating layer.

As indicated in FIG. 6, the distribution of the average value of the carrier mobility of each TFT substrate does not converge to a single straight line and is in the form of a line that bends upward along the way. This indicates that the region having a low carrier mobility average value has a different type of normal distribution, i.e., normal distribution having different average value and standard deviation, from that of the region having a high carrier mobility average value.

It is to be noted that the distribution in the low carrier-mobility-average-value side can be approximated by a straight line A having a small slope angle indicated by a dashed line. Furthermore, the distribution in the high carrier-mobility-average-value side can be approximated by a straight line B having a great slope angle indicated by a solid line.

Here, the manufactured TFT substrates can be categorized into three groups of (a) to (c) below.

(a) TFT substrates including thin-film transistors all of which having peaks of mobility curves (hereinafter referred to as a "substrate with peak").

(b) TFT substrates including thin-film transistors all of which having no peak in mobility curves (hereinafter referred to as a "substrate without peak").

(c) TFT substrates including both thin-film transistors having peaks of mobility curves and thin-film transistors having no peak in mobility curves (hereinafter referred to as a "mixed substrates").

As a result of examination on the correspondence relationship among the above categories (a) to (c) of TFT substrates with reference to the plotting result in FIG. 6, the plotted points of the substrate with peak substantially matched the distribution approximated by the straight line B. Furthermore, the plotted points of the substrate without peak substantially matched the distribution approximated by the straight line A. Then, the plotted points of the mixed substrate substantially matched the distribution in an intermediate region (region between the slope of the straight line A and the slope of the straight line B) of the aforementioned distributions. This indicates that the peak in the mobility curve has an effect of increasing the average value and the standard deviation of the carrier mobility.

As described above, the substrate with peak forms a normal distribution which is approximated by the straight line B, and the substrate without peak forms a normal distribution approximated by the straight line A. In addition, the substrate with peak and the substrate without peak can be bordered by the intermediate region.

Accordingly, as indicated in FIG. 6, it can be understood that the average value of the carrier mobility from which the plotted points start to divert from the straight line A is an average value of the carrier mobility at the cross point of the straight line A and the straight line B, specifically, approximately 13 cm$^2$/Vs. In other words, when the carrier mobility of the thin-film transistor is smaller than or equal to 13 cm$^2$/Vs, the occurrence of a peak in the mobility curve can be reduced.

Figure 7:
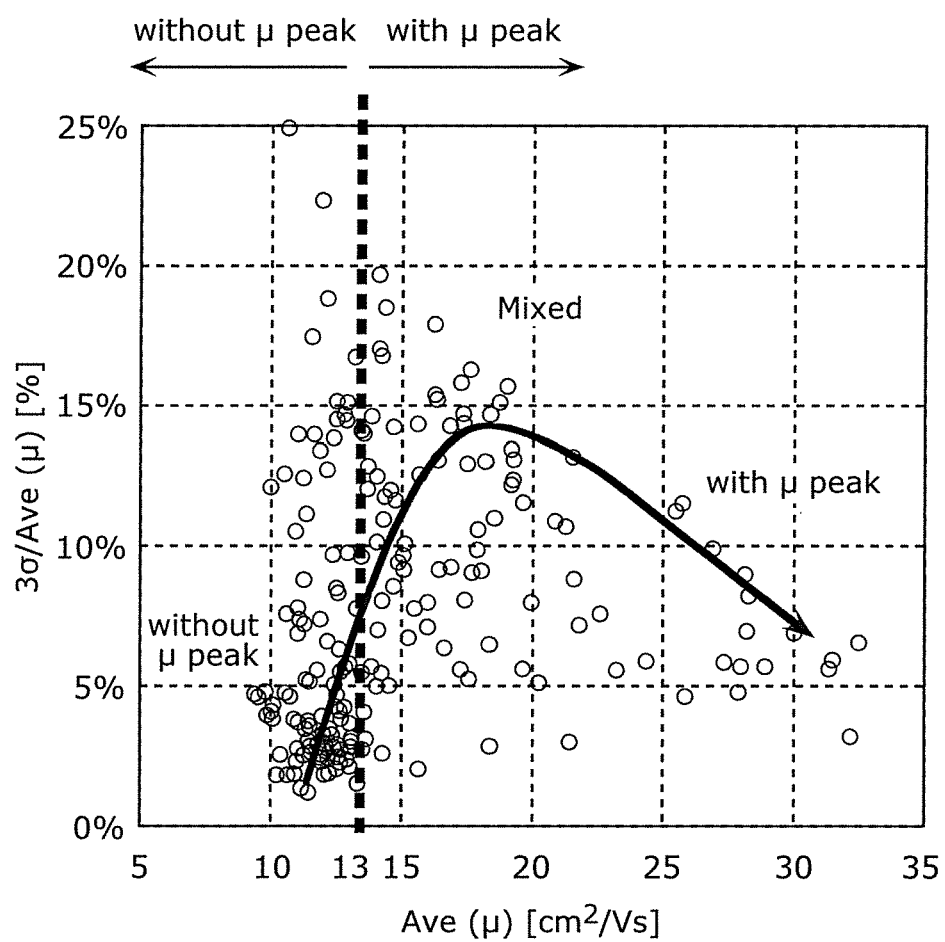
FIG. 7 is a diagram indicating correlation between an average value and variation of the carrier mobility according to the embodiment.

FIG. 7 is a diagram indicating correlation between an average value and variation of the carrier mobility according to the present embodiment. Specifically, FIG. 7 indicates, in the same manner as in FIG. 6, the correlation between the average value and the variation of the carrier mobility of each thin-film transistor obtained for each substrate by manufacturing plural lots.

The horizontal axis in FIG. 7 indicates an average value Ave (μ) of the carrier mobility of the plural thin-film transistors in the TFT substrate. Furthermore, the vertical axis indicates the variation of the carrier mobility of the plural thin-film transistors in the TFT substrate. Specifically, as an index for variation indicated by the vertical axis, a value is used which is obtained by dividing the standard deviation 3σ of the carrier mobility by an average value Ave (μ) of the carrier mobility, of the plural thin-film transistors in the TFT substrate.

Here, as explained with reference to FIG. 6, the presence of the peak in the mobility curve can be determined by referring to a case where the average value of the carrier mobility is 13 cm$^2$/Vs (bold dashed line in FIG. 7).

Furthermore, the arrow indicated by the bold solid line in FIG. 7 is an approximate curve of the distribution. As indicated by the arrow, in the range where the average value of the carrier mobility is smaller than approximately 20 cm$^2$/Vs, the average value and the variation of the carrier mobility have a positive correlation.

Accordingly, when the carrier mobility of the thin-film transistor is smaller than or equal to approximately 13 cm$^2$/Vs, the variation of the carrier mobility among the thin-film transistors in the TFT substrate can be reduced.

As described above, with the thin-film transistor according to the present embodiment, when the carrier mobility is smaller than or equal to approximately 13 cm$^2$/Vs, the occurrence of a peak in the mobility curve can be reduced and the variation of the carrier mobility in the TFT substrate can be reduced.

[Relationship Between Annealing Temperature and Carrier Mobility]

Next, description is provided on the relationship between the annealing temperature and the carrier mobility.

As described above, in the present embodiment, after the planarization layer 200 is formed, heating is performed with a temperature of 240° C. or lower. With this, the carrier mobility can be reduced to smaller than or equal to 13 cm$^2$/Vs, and the occurrence of a peak in the mobility curve can be reduced. Description on this is provided below based on the measurement result of the carrier mobility of the thin-film transistor with reference to FIG. 8 and FIG. 9.

Figure 9:
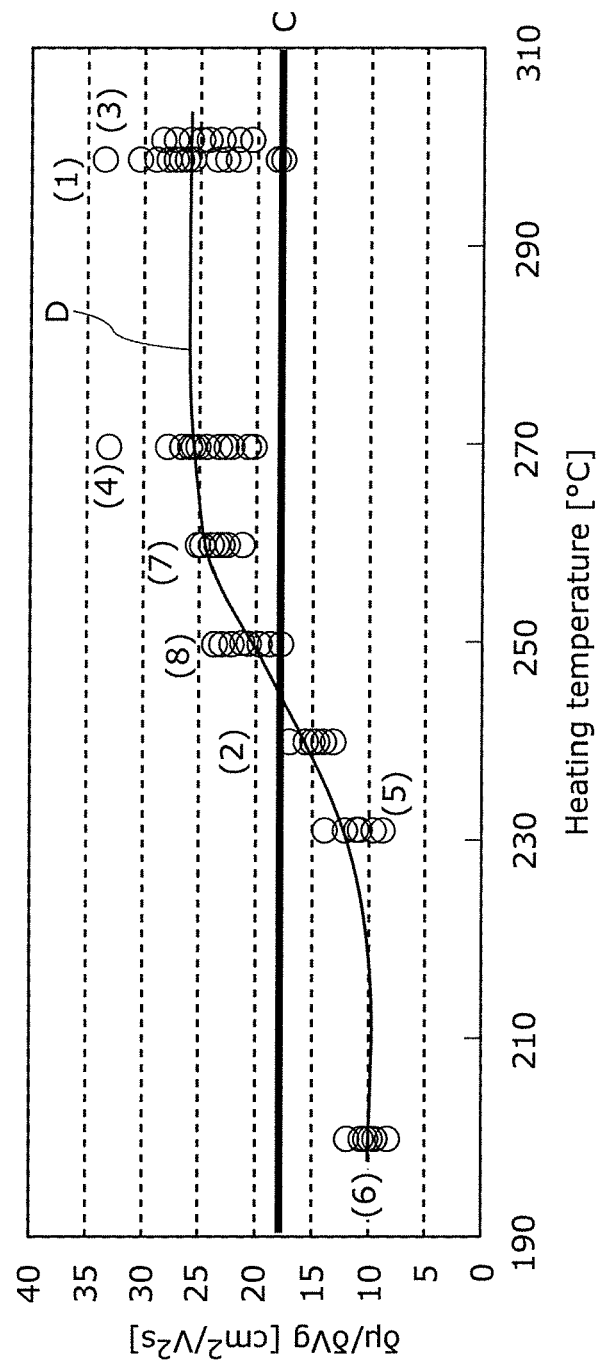
FIG. 9 is a diagram indicating a relationship between a peak in a mobility curve and heating according to the embodiment.

FIG. 8 is a diagram indicating an example of the annealing temperature in the method for manufacturing a thin-film transistor substrate according to the present embodiment. FIG. 9 is a diagram indicating a relationship between a peak in a mobility curve and heating according to the present embodiment.

The horizontal axis in FIG. 9 indicates a heating temperature. The vertical axis indicates a slope angle of a derivative value of the carrier mobility μ with respect to a gate potential (a voltage between the gate and the source) V$_g$, that is, of a mobility curve.

FIG. 9 is a diagram obtained by measuring the carrier mobility after the heating indicated in FIG. 8 is performed and plotting the carrier mobility for each heating temperature based on the measurement result. Specifically, a single point plotted for a heating temperature corresponds to the carrier motility of each of the plural thin-film transistors in a single TFT substrate. Furthermore, the processing orders (1) to (8) indicated in FIG. 8 correspond to (1) to (8) illustrated in FIG. 9.

The straight line C indicated by the bold solid line in FIG. 9 is a straight line whose carrier mobility corresponds to approximately 13 cm$^2$/Vs. Plots above the straight line C indicate that the peak in the mobility curve occurs, and plots below the straight line C indicate that the occurrence of a peak in the mobility curve is suppressed.

In the present embodiment, as indicated in FIG. 8, in the steps for forming each of the interlayer insulating layer 170, the line layer 180, the line protection layer 190, and the planarization layer 200, heating is performed under conditions of a predetermined temperature and a predetermined time period.

First, after the interlayer insulating layer 170 is deposited as illustrated in (c) in FIG. 5B, annealing is performed under conditions of 300° C. and one hour ((1) in FIG. 8). At this time, the carrier mobility is greater than approximately 13 cm$^2$/Vs, and as illustrated in (1) in FIG. 9, the plotting result is located above the straight line C.

Next, as illustrated in (a) in FIG. 5C, after the first layer 181 (ITO film) of the line layer 180 is formed, baking is performed under conditions of 240° C. and 30 minutes ((2) in FIG. 8). At this time, the carrier mobility is smaller than approximately 13 cm$^2$/Vs, and as illustrated in (2) in FIG. 9, the plotting result is located below the straight line C.

Next, after the line protection layer 190 is deposited as illustrated in (c) in FIG. 5C, annealing is performed under conditions of 300° C. and one hour ((3) in FIG. 8). At this time, the carrier mobility is greater than approximately 13 cm$^2$/Vs, and as illustrated in (3) in FIG. 9, the plotting result is located above the straight line C.

Based on the three-time heating and the measuring results, it can be understood that the carrier mobility changes reversibly.

Specifically, by heating, at a high temperature, the thin-film transistor having the carrier mobility smaller than approximately 13 cm$^2$/Vs due to heating at a low temperature, the carrier mobility can be greater than approximately 13 cm$^2$/Vs. Furthermore, by heating, at a low temperature, the thin-film transistor having the carrier mobility greater than approximately 13 cm$^2$/Vs due to heating at a high temperature, the carrier mobility can be smaller than approximately 13 cm$^2$/Vs again.

As described above, when heating is performed at a relatively high temperature, the carrier mobility becomes greater than approximately 13 cm$^2$/Vs and a peak in the mobility curve occurs. In contrast, when the heating is performed at a relatively low temperature, the carrier mobility becomes smaller than approximately 13 cm$^2$/Vs and the occurrence of peak in the mobility curve is suppressed.

Accordingly, it can be understood that, in order to suppress the peak in the mobility curve, it is sufficient to eventually perform heating at a low temperature, that is low-temperature annealing (also referred to as "additional annealing").

Performing the additional annealing allows for supplement of oxygen defect at an interface closer to a back channel of the oxide semiconductor layer 140. With this, the carrier density is lowered and the occurrence of the peak in the mobility curve is suppressed.

Accordingly, the advantageous effect of suppressing the occurrence of a peak in the mobility curve brought by the additional annealing is decreased as the total film thickness of the layers deposited on the oxide semiconductor layer 140 increases. Thus, it is preferable that the additional annealing is performed immediately after the planarization layer is formed.

Accordingly, in the present embodiment, the heating is performed under conditions of 270° C. and one hour ((4) in FIG. 8), after the planarization layer 200 is formed as illustrated in (b) in FIG. 5D. This is a step for performing thermal curing of the planarization layer 200 comprising a polyimide material to form a planarization layer having an excellent film quality, as described above.

With this step, as illustrated in (4) in FIG. 9, the plotting result is positioned above the straight line C, the carrier mobility becomes greater than approximately 13 cm$^2$/Vs, and the peak in the mobility curve occurs. Accordingly, by performing heating at a low temperature after the step of forming the planarization layer 200, specifically, after the step of heating at a temperature of 250° C. or higher which is performed after the polyimide material is deposited, the carrier mobility is reduced and the occurrence of the peak in the mobility curve is reduced. In the present embodiment, for example, the heating at a low temperature is performed after the contact hole 191 of the line protection layer 190 is formed, as illustrated in (c) in FIG. 5D.

Below describes a result of steps indicated in (5) to (8) in FIG. 8 performed in order to find out an appropriate temperature for heating performed after the step of forming the planarization layer 200. It is to be noted that the steps indicated in (5) to (8) in FIG. 8 are performed sequentially, and a step of making the carrier mobility greater than approximately 13 cm$^2$/Vs by heating under conditions of 300° C. and one hour is performed before the next step is performed. In other words, at a time point when each of the steps (5) to (8) in FIG. 8 is started, the targeted thin-film transistor is in a state where the peak in the mobility curve occurs.

As illustrated in (5) and (6) in FIG. 9, when the temperature of heating is 230° C. and 200° C., the carrier mobility becomes smaller than approximately 13 cm$^2$/Vs, and the plotting result is positioned below the straight line C. In contrast, as illustrated in (7) and (8) in FIG. 9, when the temperature of heating is 260° C. and 250° C., the carrier mobility becomes greater than approximately 13 cm$^2$/Vs, and the plotting result is positioned above the straight line C.

The approximate curve of the plotting result illustrated in (1) to (8) in FIG. 9 is a curve D. The cross point of the curve D and the straight line C presents at approximately 245° C., as illustrated in FIG. 9. In other words, the eventual heating at a low temperature is performed at 245° C. or below, and preferably 240° C. or lower.

Furthermore, as illustrated in (6) in FIG. 9, when the heating is performed at 200° C., the carrier mobility is smaller than approximately 13 cm$^2$/Vs and the occurrence of a peak in the mobility curve is suppressed. Accordingly, it can be understood that the occurrence of a peak in the mobility curve is suppressed when heating is performed at least 200° C. or higher.

CONCLUSION

Figure 10:
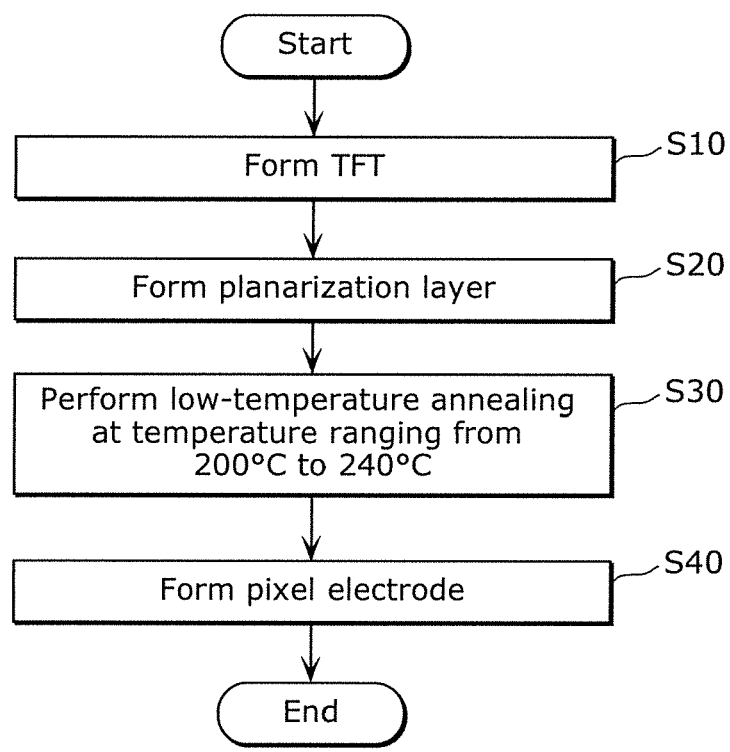
FIG. 10 is a flowchart indicating the method of manufacturing a thin-film transistor substrate according to the embodiment.

Based on the above, the TFT substrate 20 according to the present embodiment can be manufactured according to the flowchart indicated in FIG. 10, for example. FIG. 10 is a flowchart indicating a method of manufacturing the TFT substrate 20 according to the present embodiment.

In the present embodiment, as explained in FIG. 5A to FIG. 5C, the thin-film transistor 100 is formed first (S10). Next, the planarization layer 200 is formed above the thin-film transistor 100 (S20).

After the planarization layer 200 is formed, the low-temperature annealing on the thin-film transistor 100 is performed (S30). Specifically, the thin-film transistor 100 is annealed at a temperature in a range from 200° C. to 240° C. Then, after the low-temperature annealing, the pixel electrode 210 of the organic EL element is formed on the planarization layer 200 (S40).

As described above, in the present embodiment, the low-temperature annealing on the thin-film transistor 100 is performed after the planarization layer 200 is formed and before one of the plural layers of the organic EL element is formed. Specifically, the low-temperature annealing is performed before the pixel electrode 210 is formed, as illustrated in FIG. 10. In other words, the low-temperature annealing is performed immediately after the planarization layer 200 is formed.

As described above, the method of manufacturing a TFT substrate 20 according to the present embodiment is a method of manufacturing the thin-film transistor substrate 20 which includes a thin-film transistor 100, the method including: forming a planarization layer comprising polyimide material above the thin-film transistor 100; and heating the thin-film transistor 100 at a temperature of 240° C. or lower after the planarization layer 200 is formed.

With this, by performing heating at a low temperature of 240° C. or lower, occurrence of a peak in the mobility curve can be suppressed. For example, when the heating is performed at a high temperature before the planarization layer 200 is formed, the peak in the mobility curve occurs. Even in this case, since the heating is performed at a low temperature of 240° C. or lower after the planarization layer 200 is formed, the occurrence of the peak in the mobility curve can be suppressed. Accordingly, the reliability of the thin-film transistor 100 can be enhanced.

Other Embodiments

As described above, the embodiment has been explained as an example of the technique disclosed in the present application. However, the technique in the present disclosure is not limited to the above, and may be applied to embodiments obtained by modifying, replacing, adding, and omitting the above embodiment as appropriate.

For example, although the heating at 240° C. or lower is performed after the contact hole 191 is formed as illustrated in (c) in FIG. 5D in the above embodiment, this is not an only example. For example, the heating at 240° C. or lower may be performed before the contact hole 191 is formed, specifically, after the contact hole 201 is formed as illustrated in (b) in FIG. 5D and after the thermal curing of the planarization layer 200 is performed.

Furthermore, although the peak suppression effect may be decreased as compared to the case where the low-temperature annealing is performed immediately after the planarization layer 200 is formed, the heating at 240° C. or lower may be performed after the pixel electrode 210 is formed. Even in this case, the occurrence of the peak in the mobility curve can be suppressed as compared to the case where the low-temperature annealing is not performed.

Furthermore, the TFT substrate 20 does not have to include a line protection layer 190. For example, the planarization layer 200 may be formed on the line layer 180.

Furthermore, although the above embodiment indicates an example of the line layer 180 having a four-layer structure, this is not an only example. The line layer 180 may be a single-layered film such as a copper film, for example. Furthermore, although an example where the line layer 180 is connected to the drain electrode 160d is indicated, the line layer 180 may be connected to the source electrode 160s.

Furthermore, the TFT substrate 20 does not have to include the line layer 180. For example, the planarization layer 200 may be formed on the source electrode 160s and the drain electrode 160d. Alternatively, the planarization layer 200 may be formed on the interlayer insulating layer 170.

Furthermore, for example, although the contact holes 151 and 152 are formed after the entire surface of the channel protection film (insulating film) is deposited as illustrated in (d) in FIG. 5A and (a) in FIG. 5B in the above embodiment, this is not an only example. For example, the channel protection layer 150 may be formed which is patterned in a predetermined shape in advance so as to expose the oxide semiconductor layer 140.

In other words, in the step of forming the channel protection layer 150, it is sufficient that the channel protection layer 150 is formed so as to partially expose the oxide semiconductor layer 140. Furthermore, in the step of forming the source electrode 160s and the drain electrode 160d, it is sufficient that the source electrode 160s and the drain electrode 160d are formed so as to be connected to the exposed part of the oxide semiconductor layer 140.

The layer which requires patterning in a predetermined shape, such as the oxide semiconductor layer 140, is also formed in the same manner. Specifically, instead of patterning the oxide semiconductor film after the entire surface is deposited, the oxide semiconductor layer 140 patterned into a predetermined shape in advance may be formed.

Furthermore, in the above embodiment, the oxide semiconductor used for the oxide semiconductor layer 140 is not limited to amorphous InGaZnO. For example, a polycrystalline semiconductor such as polycrystalline InGaO may be used.

Furthermore, although the configuration of the thin-film transistor 100 including the oxide semiconductor layer 140 is explained in the above embodiment, this is not an only example. The thin-film transistor 100 may include a semiconductor layer comprising, as a main component, a non-oxide semiconductor material such as a single crystal semiconductor and a compound semiconductor.

Furthermore, although the above embodiment has explained an example in which the thin-film transistor 100 is a bottom-gate type and a channel-protection type thin-film transistor, this is not an only example. The thin-film transistor 100 may be a bottom-gate type and a channel-etch type thin-film transistor. Alternatively, the thin-film transistor 100 may be a top-gate type thin-film transistor.

Furthermore, although the organic EL display device 10 is explained as a display device equipped with the thin-film transistor 100 in the above embodiment, the thin-film transistor 100 in the above embodiment is also applicable to other display devices adopting the active matrix substrate such as a liquid crystal display device.

Furthermore, the display device (display panel) such as the above-described organic EL display device 10 can be used as a flat panel display, and is applicable for any electronic devices having a display panel, such as television sets, personal computers, and mobile phones. The display device is particularly suitable for large-screen and high-definition display devices.

Other forms in which various modifications apparent to those skilled in the art are applied to the embodiment and the modification, or forms structured by combining constituent elements of different embodiments and modifications are included within the scope of the present invention, unless such changes and modifications depart from the scope of the present invention.

INDUSTRIAL APPLICABILITY

The method of manufacturing a thin-film transistor substrate according to one or more exemplary embodiments disclosed herein is applicable to a method of manufacturing a display device such as an organic EL display device, for example.

The invention claimed is:
1. A method of manufacturing a thin-film transistor substrate which includes a thin-film transistor, the method comprising:
  preparing a substrate;
  forming a gate electrode in a predetermined shape on the substrate;
  forming a gate insulating layer on the substrate and the gate electrode, the gate insulating layer covering the gate electrode;
  forming an oxide semiconductor layer in a predetermined shape on the gate insulating layer, the oxide semiconductor layer facing the gate electrode;
  forming a channel protection layer on the gate insulating layer and the oxide semiconductor layer, the channel protection layer covering the oxide semiconductor layer;
  removing parts of the channel protection layer to form first and second contact holes, the first and second contact holes each partially exposing the oxide semiconductor layer;
  forming source and drain electrodes in predetermined shapes on the channel protection layer, the source and drain electrodes being connected to the oxide semiconductor layer via the first and second contact holes;
  forming an interlayer insulating film on the channel protection layer and the source and drain electrodes, the interlayer insulating film covering the source and drain electrodes;

heating, after the interlayer insulating film is formed, the thin-film transistor substrate to increase a resistance of the oxide semiconductor layer;

removing a part of the interlayer insulating film to form a third contact hole, the third contact hole partially exposing one of the source and drain electrodes;

forming a first line layer in a predetermined shape on the interlayer insulating film, the first line layer being connected to the one of the source and drain electrodes via the third contact hole;

heating, after the first line layer is formed, the thin-film transistor substrate to decrease the resistance of the oxide semiconductor layer;

forming second, third, and fourth line layers in predetermined shapes on the first line layer;

forming a line protection layer on the interlayer insulating film and the fourth line layer, the line protection layer covering the first, second, third, and fourth line layers;

heating, after the line protection layer is formed, the thin-film transistor substrate to increase the resistance of the oxide semiconductor layer;

forming a planarization layer comprising a polyimide material on the line protection layer;

removing a part of the planarization layer to form a fourth contact hole, the fourth contact hole partially exposing the line protection layer;

heating, after removing the part of the planarization layer, the polyimide material of the planarization layer at a temperature of 250° C. or higher to thermally cure the polyimide material;

removing a part of the line protection layer to form a fifth contact hole, the fifth contact hole being aligned with the fourth contact hole and partially exposing the fourth line layer;

heating, after the planarization layer is formed, the thin-film transistor substrate at a temperature of 240° C. or lower, without directly exposing the oxide semiconductor layer to a heating environment; and forming a pixel electrode on the planarization layer after the heating at the temperature of 240° C. or lower, the pixel electrode being connected to the fourth line layer via the fourth contact hole and the fifth contact hole.

2. A thin-film transistor substrate which includes a thin-film transistor, the thin-film transistor substrate comprising:

a substrate;

a gate electrode in a predetermined shape on the substrate;

a gate insulating layer on the substrate and the gate electrode, the gate insulating layer covering the gate electrode;

an oxide semiconductor layer in a predetermined shape on the gate insulating layer, the oxide semiconductor layer facing the gate electrode;

a channel protection layer on the gate insulating layer and the oxide semiconductor layer, the channel protection layer covering the oxide semiconductor layer, the channel protection layer including first and second contact holes that each partially expose the oxide semiconductor layer;

source and drain electrodes in predetermined shapes on the channel protection layer, the source and drain electrodes being connected to the oxide semiconductor layer via the first and second contact holes;

an interlayer insulating film on the channel protection layer and the source and drain electrodes, the interlayer insulating film covering the source and drain electrodes, the interlayer insulating film including a third contact hole that partially exposes one of the source and drain electrodes;

a first line layer in a predetermined shape on the interlayer insulating film, the first line layer being connected to the one of the source and drain electrodes via the third contact hole;

second, third, and fourth line layers in predetermined shapes on the first line layer;

a line protection layer on the interlayer insulating film and the fourth line layer, the line protection layer covering the first, second, third, and fourth line layers, the line protection layer including a fourth contact hole that partially exposes the fourth line layer;

a planarization layer comprising a polyimide material on the line protection layer, the planarization layer including a fifth contact hole aligned with the fourth contact hole that partially exposes the fourth line layer; and a pixel electrode on the planarization layer, the pixel electrode being connected to the fourth line layer via the fourth contact hole and the fifth contact hole, wherein a resistance of the oxide semiconductor layer is increased due to a first heating process performed after the interlayer insulating film is formed and a third heating process performed after the line protection layer is formed;

the resistance of the oxide semiconductor layer is decreased due to a second heating process performed after the first line layer is formed, the polyimide material of the planarization layer is thermally cured due to a fourth heating process performed at a temperature of 250° C. or higher while the planarization layer is formed, and an occurrence of a peak in a mobility curve of the thin-film transistor is suppressed due to a fifth heating process performed at a temperature of 240° C. or lower after the planarization layer is formed, without directly exposing the oxide semiconductor layer to a heating environment.

* * * * *